United States Patent

Ohmi et al.

[11] Patent Number: 5,487,398
[45] Date of Patent: Jan. 30, 1996

[54] ROTARY CLEANING METHOD WITH CHEMICAL SOLUTIONS AND ROTARY CLEANING APPARATUS WITH CHEMICAL SOLUTIONS

[75] Inventors: Tadahiro Ohmi, 1-17-301, Komegabukuro 2-chome, Aoba-ku, Sendai-shi, Miyaga-ken 980; Naomichi Yonekawa, Sendai; Hiroyuki Horiki; Toshimitsu Kaji, both of Tokyo; Fumitomo Kunimoto, Sendai; Takeo Tamaki, Urawa, all of Japan

[73] Assignees: Tadahiro Ohmi, Miyagi; Nisso Engineering Co., Ltd., Tokyo; MTC Co., Ltd., Saitama, all of Japan

[21] Appl. No.: 262,602

[22] Filed: Jun. 20, 1994

[30] Foreign Application Priority Data

Jun. 22, 1993 [JP] Japan .................................. 5-150897

[51] Int. Cl.⁶ ........................................................ B08B 3/04
[52] U.S. Cl. ................... 134/95.1; 134/102.2; 134/99.2; 134/102.3; 134/902; 134/153; 134/97.1
[58] Field of Search ........................ 134/94.1, 95.1, 134/97.1, 98.1, 102.1, 102, 3, 200, 902, 153, 56 R, 57 R, 58 R, 99.2, 99.1

[56] References Cited

U.S. PATENT DOCUMENTS

| 4,982,753 | 1/1991 | Grebinski et al. | 134/95.1 |
| 5,154,199 | 10/1992 | Thompson et al. | 134/200 |
| 5,361,787 | 11/1994 | Miyazaki et al. | 134/57 R |
| 5,361,789 | 11/1994 | Yoshida et al. | 134/902 |
| 5,372,652 | 12/1994 | Srikrishnan et al. | 134/902 |

FOREIGN PATENT DOCUMENTS

| 4-125921 | 4/1992 | Japan | 134/902 |
| 4-113620 | 4/1992 | Japan | 134/902 |
| 4-346431 | 12/1992 | Japan | 134/902 |

*Primary Examiner*—Frankie L. Stinson
*Attorney, Agent, or Firm*—Baker & Daniels

[57] ABSTRACT

To provide a cleaning method and a cleaning apparatus for decreasing the total cost by producing high-performance semiconductor using silicon wafers with cleaner surface, decreasing the semiconductor production cost, decreasing the consumption of chemical solutions and the cleaning time by using a new cleaning method and apparatus, simplifying the recovery of waste liquids, and decreasing equipment investment.

A cleaning method having a plurality of chemical-solution-cleaning processes characterized by performing a chemical-solution-cleaning process for continuously feeding a chemical solution to the surface of an object to be cleaned from an upper part of the object surface by horizontally setting the object in a cleaning bath, closing the bath, and then rotating the object and an ultrapure-water-cleaning process for feeding ultrapure water in order for each chemical solution in the same cleaning bath; and thereafter drying the object after cleaning it.

14 Claims, 5 Drawing Sheets

ROTARY CLEANING METHOD WITH CHEMICAL SOLUTIONS AND ROTARY CLEANING APPARATUS WITH CHEMICAL SOLUTIONS

TECHNICAL FIELD

The present invention relates to a cleaning apparatus and a cleaning method used for cleaning a semiconductor substrate or the like with chemical solutions, particularly to a cleaning apparatus and a cleaning method for safely performing accurate continuous cleaning at a low cost in a short time by cleaning an object to be cleaned (e.g. a silicon wafer) in a cleaning bath while rotating the object.

BACKGROUND ART

The background of the invention is described below by using a silicon wafer as an object to be cleaned.

Cleaning of a silicon wafer in the semiconductor industry is one of the most-important semiconductor producing processes.

That is, a lot of impurity particles are attached on a silicon wafer. Therefore, if a device is formed on the silicon wafer without removing the particles, only a device having bad characteristics can be obtained. Therefore, a silicon wafer is generally cleaned with demineralized water to remove impurities.

The following are objects particularly affecting a semiconductor device on the surface of a wafer.

(1) Particles
(2) Organic contaminants
(3) Metallic impurities
(4) Native oxides
(5) Surface micro roughness
(6) Molecules adsorbed on the surface However, only particles can be removed by demineralized water but native oxides formed on the surface cannot be removed. Moreover, it is difficult to remove fine particles among particles by demineralized water.

Therefore, cleaning is performed by using various types of chemical solutions. One of them is RCA cleaning.

However, the RCA cleaning is not greatly improved compared with the RCA cleaning in its early stages. Therefore, in fact, cleaning is performed in many processes for a long time.

The RCA cleaning removes organic contaminants from the substrate surface by oxidizing them. Its treatment processes are roughly shown below.

Cleaning with $H_2SO_4$, $H_2O_2$, and ultrapure water
Cleaning with ultrapure water
Cleaning with HF, $H_2O_2$, and ultrapure water
Cleaning with ultrapure water
Cleaning with $NH_4OH$, $H_2O_2$, and ultrapure water Cleaning with ultrapure water Cleaning with hot ultrapure water Cleaning with ultrapure water Cleaning with HF, $H_2O$, and ultrapure water Cleaning with ultrapure water Cleaning with HCl, $H_2O_2$, ultrapure water Cleaning with hot ultrapure water
Cleaning with HF, $H_2O_2$, ultrapure water
Cleaning with ultrapure water
Drying However, because these cleaning processes are performed by using an independent cleaning apparatus or cleaning bath for each chemical solution and successively soaking a silicon wafer in a cleaning bath storing each chemical solution and ultrapure water, it cannot be avoided that a chemical solution used in a previous process remains on the wafer and thereby mutual contamination occurs between chemical solutions in cleaning baths.

Moreover, because a wafer is transferred to the next cleaning bath through the air, it is contaminated by the air or causes native oxides to be produced in the air. Furthermore, because contaminated chemical solutions are used several times or a plurality of silicon wafers are cleaned at the same time, impurities removed from a silicon wafer easily attach to other silicon wafer.

These contaminants during cleaning cause the yield to decrease and the cost to increase. Moreover, because the present cleaning processes require a long time, it is a problem that the cost is increased due to the long-time cleaning.

Because a cleaning apparatus used for cleaning performs only one type of cleaning in one bath, it is impossible to perform continuous cleaning in the same bath. Therefore, many cleaning apparatuses and cleaning spaces are necessary, causing the investment of equipment to increase.

Moreover, higher cleanliness of wafer surface is required because integration level has been improved in recent years. However, the above cleaning method cannot correspond to the requirement.

Therefore, a cleaning method and a cleaning apparatus are desired which realize higher-cleanliness cleaning in a short time.

It is an object of the present invention to provide a cleaning method and a cleaning apparatus for decreasing the total cost due to production of high-performance semiconductor by using cleaner silicon-wafer surface, decrease of the cost for semiconductor production, decrease of the consumption of chemical solutions by using a new cleaning method and a new cleaning apparatus, decrease of the cleaning time, decrease of the number of types of chemical solutions used, easiness of waste liquid, and decrease of investment on equipment.

DISCLOSURE OF THE INVENTION

The cleaning method of the present invention including a plurality of chemical-solution-cleaning processes is characterized by performing a chemical-solution-cleaning process of horizontally arranging objects to be cleaned in a cleaning bath and closing the cleaning bath, and thereafter continuously supplying a chemical solution onto the surface of the objects to be cleaned and an ultrapure-water-cleaning process of supplying ultrapure water in order in the same cleaning bath for each chemical solution and then drying the objects.

The cleaning apparatus of the present invention comprises at least:

a cleaning bath having a movable cover at its top so that the apparatus can be sealed when closing the cover;

object-to-be-cleaned holding means for holding an object to be cleaned in the cleaning bath;

rotating means for rotating the object-to-be-cleaned holding means;

gas introducing means for introducing a gas into the cleaning bath;

a first nozzle for spraying a first chemical solution onto the surface of the object to be cleaned held by the object-to-be-cleaned holding means;

a second nozzle for spraying a second chemical solution onto the surface of the object to be cleaned held by the object-to-be-cleaned holding means;

a third nozzle for spraying the first chemical solution onto the back of the object to be cleaned held by the object-to-be-cleaned holding means;

a fourth nozzle for spraying the second chemical solution onto the back of the object to be cleaned held by the object-to-be-cleaned holding means;

a fifth nozzle for spraying ultrapure water onto the surface of the object to be leaned held by the object-to-be-cleaned holding means;

a sixth nozzle for spraying ultrapure water onto the back of the object to be cleaned held by the object-to-be-cleaned holding means;

a chemical-solution feed line connected to the first to the fourth nozzles respectively;

an external chemical-solution feeder for feeding a chemical solution, connected to each chemical-solution feed line;

an ultrapure water feed line connected to the fifth and sixth nozzles;

ozone adding means for selectively adding ozone to ultrapure water; and a drainage system for perfectly separating waste liquids after cleaning.

The holding means of the present invention for a wafer having an orientation flat comprises a spindle, at least three arms extending from the top of the spindle in the radius direction, and a protrusion having a terraced portion and formed at the tip of each arm; wherein the protrusions are arranged so that the inside of at least one protrusion contacts the lateral of the orientation flat of the wafer and the insides of other protrusions contact the periphery of the circular arc portion of the object to be cleaned.

Functions

Functions of the present invention are described below together with the knowledge obtained in making the present invention.

Cleaning method

An art of cleaning a substrate while rotating it is hitherto known. However, the art is a cleaning technique using demineralized water. An art of cleaning a substrate with a chemical solution while rotating it is not known at present. An art of cleaning a substrate with a plurality of chemical solutions while rotating it is not known either.

The inventor of the present invention thought that the improvement of cleanliness is limited in the cleaning by the soaking method and therefore attempted rotary cleaning.

Particles slightly attached to a surface can be removed by rotary cleaning using demineralized water. However, it is completely unknown whether other contamination sources, particularly, native oxides formed on the surface can be removed by the rotary cleaning with chemical solutions.

The inventor of the present invention performed various types of cleaning with chemical solutions by using the apparatus shown in FIG. 10 (disclosed in the official gazette of Japanese Patent Application Laid-Open No. SHO-52-58458/1977) and spraying ozone-added ultrapure water, a mixture of HF, $H_2O_2$, and ultrapure water, and a mixture of $NH_4OH$, $H_2O_2$, and ultrapure water through a nozzle in order while rotating a substrate.

As the result of measuring the surface cleanliness after ending the above types of cleaning, native oxides remained on the surface. This was far from perfect cleaning. Moreover, the surface after cleaned was rough.

Though the cause was unknown, the inventor of the present invention attempted dropping feed of feeding every several drops of a chemical solution onto the surface instead of spraying the chemical solution onto the surface. As a result, it was found that the number of contamination sources in the case of dropping feed was less than the number of contamination sources in the case of spraying. However, a satisfactory cleanliness was not obtained.

Therefore, as the result of repeating the experiment, it was found that it was very important to continuously feed a chemical solution or ultrapure water not in the form of a drop but in the form of a fluid. That is, it is important to feed a chemical solution or ultrapure water not intermittently but continuously like city water coming out of a faucet.

The cleaning mechanism in the rotary cleaning when continuously feeding a chemical flow is not clarified. However, the following mechanism is considered. That is, when a chemical solution is fed to the surface of an object to be cleaned in accordance with continuous flow of the chemical solution, the chemical solution extends in the radius direction due to the centrifugal force to cover the surface and it reacts on contamination sources on the surface to produce reaction products. The reaction products is immediately removed from the surface together with the chemical solution due to a centrifugal force and a new surface is exposed. Because the chemical solution is continuously fed, the newly-exposed surface of the object to be cleaned reacts on a fresh chemical solution. Thus, it is considered that cleaning can be performed at a high cleanliness because a new surface continuously contacts a fresh chemical solution.

It is preferable to set a chemical-solution feed position to the rotational center of an object to be cleaned in order to further uniformly clean the surface.

As described above, the present invention realizes high-cleanliness cleaning. However, it is more marvelous that the high-cleanliness cleaning can be performed in a very short time.

For example, to remove a noble metal impurities (e.g. Cu) with an $HF-H_2O_2$ cleaning solution, it takes approx. 60 min to realize the level of 10 atoms/cm$^2$ when using the soaking method. However, the rotary cleaning method of the present invention realizes the level in a very short time of approx. 30 sec.

The inventor of the present invention did not forecast that the high cleanliness can be achieved in a short time and the true reason why the unexpected effect could be achieved is not definite.

In the case of spraying, it is estimated that a chemical solution does not uniformly cover an object to be cleaned because it is fed in the form of fog and therefore cleaning at a high cleanliness cannot be achieved.

In the case of the present invention, various types of chemical-solution-cleaning are performed in the same cleaning bath. When various types of cleaning are performed in different cleaning baths, an object to be cleaned is exposed to the air during transfer to cause native oxides to be formed on the surface and the cleanliness to lower. However, it is possible to prevent the cleanliness from lowering by performing various types of cleaning in the same bath.

(Water sprinkling process)

In the present invention, it is preferable to sprinkle water an object to be cleaned by rotating the object at 100 to 400 rpm before cleaning it with a chemical solution. The feed rate of ultrapure water depends on the surface area of an object to be cleaned. In the case of a wafer with a diameter of 3 to 8 inches, it is preferable to feed ultrapure water of 2.5 to 10 cc to the surface of the object to be cleaned.

An art of decreasing the number of particles attached on the surface of a wafer by soaking the wafer in demineralized water and thereafter soaking it in a cleaning chemical solution is disclosed in the official gazette of Japanese Patent Application Laid-Open No. HEI-3-240229.

In the case of the rotary cleaning, however, it is found that the particles attached on the surface of a wafer cannot always be decreased only by feeding demineralized water to the surface.

Therefore, as the result of eagerly following up factors for constantly decreasing the attached particles, it is found that the factors include the feed rate of demineralized water and the rotational speed of an object to be cleaned.

That is, demineralized water of less than 2.5 cc cannot completely cover the wafer surface. For demineralized water of more than 10 cc, however, only some ultrapure water flows to form a channel. Thereafter, when a chemical solution is fed, the chemical solution preferentially flows through the channel and this prevents uniform cleaning.

Of course, the above phenomenon is first found by the inventor of the present invention.

When the rotational speed is less than 100 rpm, it may not possible to entirely cover the wafer surface with sprinkled water. That is, a dry portion may occur. When the rotational speed exceeds 400 rpm, part of a sprinkled water layer formed on the surface may be destroyed and the chemical solution preferentially enters the destroyed portion to cause the surface to be unevenly cleaned.

(Atmosphere of inert gas)

For the present invention, it is preferable to continuously flow an inert gas in the way of downflow. By using the atmosphere of an inert gas, it is possible to prevent an object to be cleaned from being exposed to the air and an oxide film from being formed. In a practical manner, because water (ultrapure water) is always present in the cleaning process, it is considered that native oxides are formed even if the atmosphere of an inert gas is used. Therefore, it is nonsense to use the atmosphere of an inert gas in the cleaning process. However, it is found from the knowledge of the inventor of the present invention that both water and oxygen are indispensable to form native oxides. That is, it is found that native oxides are not formed when water or oxygen is independently present. Therefore, it is possible to prevent native oxides from being formed by using the atmosphere of an inter gas. From this point of view, it is preferable to keep the oxygen content in an inert gas at 100 ppb or less, more preferable to keep it at 100 ppb or less, and most preferable to keep it at 1 ppb or less.

Nitrogen is particularly preferable as an inert gas. At present, nitrogen is used to generate an internal pressure, a downflow atmosphere is generated, and a cleaning bath is completely closed so that a silicon wafer under the cleaning process is not exposed to the air. As a result, a cleanliness which cannot be realized by an existing cleaning apparatus is achieved.

Moreover, it is preferable to introduce a gas so that the pressure in the cleaning bath gets higher than the external pressure. By making the pressure in the cleaning bath higher than the external pressure, it is possible to prevent the air from leaking into the cleaning bath and more effectively prevent native oxides from being formed.

It is preferable to introduce an inert gas into the cleaning bath in the way of downflow. In the case of downflow, it is possible to prevent reaction products from attaching to an object to be cleaned and perform higher-cleanliness cleaning because the products removed from the surface fall along the flow of the gas.

Moreover, it is preferable to set the flow rate of the inert gas to a value which does not disturb a chemical solution layer formed on the surface of the object to be cleaned.

Furthermore, it is preferable to prevent the external air from leaking by introducing the inert gas and thereby making the pressure in the cleaning bath higher than the pressure outside the cleaning bath.

Furthermore, it is preferable to continuously flow the inert gas not only in cleaning the object to be cleaned in the cleaning bath but also in introducing the object to be cleaned into the cleaning bath. Though the object to be cleaned contacts the air when it is brought in or out, the frequency for the object surface to contact the air decreases by continuously flowing the inert gas.

(Chemical solution)

The cleaning process includes:

<1> Ozone-added cleaning with ultrapure water

Cleaning with ultrapure water

<2> Cleaning with HF, $H_2O_2$, and ultrapure water

Cleaning with ultrapure water

<3> Cleaning with $NH_4OH$, $H_2O_2$, and ultrapure water

Cleaning with ultrapure water

Cleaning with hot ultrapure water

Cleaning with ultrapure water

<4> Cleaning with HF, $H_2O_2$, and ultrapure water

Cleaning with ultrapure water

In the process <1>, organic contaminants on the surface are oxidized with ozone-added ultrapure water and at the same time, an oxide film is formed on the surface of a silicon wafer, and then the wafer surface is rinsed with ultrapure water to wash ozone-added ultrapure water and impurities away.

In the process <2>, native oxides on the surface are separated by a mixture of hydrofluoric acid, hydrogen peroxide, and ultrapure water and then the surface is rinsed with ultrapure water to wash chemical solutions and impurities away.

In the process <3>, particulates on the surface are removed by a mixture of ammonium hydroxide, hydrogen peroxide, and ultrapure water and the surface is rinsed with ultrapure water to wash chemical solutions and impurities away.

In the process <4>, native oxides are separated again by a mixture of hydrofluoric acid, hydrogen peroxide, and ultrapure water similarly to the process <1> to wash chemical solutions and impurities away will ultrapure water.

Finally, an object to be cleaned is rotated and dried to complete all processes. All of the above processes are continuously performed in one cleaning bath.

It is preferable to set the rotational speed of the object to be cleaned to a value most suitable for each process.

(Ozone concentration)

It is preferable to set the ozone concentration to 2 to 10 ppm.

When the ozone concentration is less than 2 ppm, organic contaminants may insufficiently be oxidized. When the ozone concentration exceeds 10 ppm, the oxide film formed on the surface of the object to be cleaned may become too thick, it may take a lot of time to remove the film, and the surface roughness may be degraded.

(Rotational speed and feed rate of chemical solution)

The rotational speed of an object to be cleaned is an important factor for high-cleanliness cleaning when the object is cleaned with a chemical solution. Therefore, it is preferable to set the rotational speed to 100 to 3,000 rpm, more preferably to set it to 200 to 1,500 rpm.

When the rotational speed is less than 100 rpm, it is impossible to entirely cover the surface of an object to be cleaned with a chemical solution if the chemical solution is too little, small. Thus, a dry portion is produced and the cleaning efficiency may lower. However, if the chemical solution is too much, it may overflow from the surface before it is expanded due a centrifugal force. Therefore, when the rotational speed is less than 100 rpm, it is difficult to keep the feed rate of the chemical solution at the optimum value.

When the rotational speed exceeds 3,000 rpm, some of the chemical solution is transformed into mist, collides with the inner wall of a cleaning bath, and attaches to the surface of an object to be cleaned to probably contaminate the cleaned surface. Moreover, an object to be cleaned may float while it is cleaned though depending on the weight of the object.

It is preferable to set the feed rate of a chemical solution to 100 ml/min to 500 ml/min. Because cleaning is instantaneously completed, the consumption of the chemical solution greatly decreases compared with the case of the existing cleaning method.

(Back cleaning)

It is preferable to spray a chemical solution onto both the surface and the back of an object to be cleaned because the back may unevenly be cleaned due to the chemical solution incoming from the surface of the object.

(Inner-wall surface cleaning)

In the case of rotary cleaning, a chemical solution splashes from the surface of an object to be cleaned due to a centrifugal force. In this case, it is found that the splashed chemical solution attaches to the inner wall of a cleaning bath. It is also found that the chemical solution attached to the inner wall separates from the inner wall and attaches to the surface of the object to be cleaned. Therefore, it is preferable to remove the attached chemical solution from the inner wall of the cleaning bath by continuously cleaning the inner wall in the chemical-solution-cleaning process and the ultrapure-water-cleaning process in order to realize high-cleanliness cleaning.

Cleaning apparatus

The operation of the apparatus of the present invention is described below by referring to FIG. 1.

The apparatus of the present invention has a cleaning bath which has a movable cover at its top.

(Cleaning bath)

FIG. 3 is a schematic view of a cleaning bath.

* Material

Though the material of the cleaning bath of the present invention is not restricted, it is preferable to use a material having conductivity, heat resistance, and chemical resistance.

The inventor of the present invention found that a cleaning bath was electrified with static electricity while eagerly following up causes in which impurities such as particulates are produced in the cleaning process. Moreover, the inventor found that, when a cleaning bath was electrified, impurities such as particulates attached to the inner wall of the cleaning bath and the attached impurities such as particulates attached to a wafer again. Therefore, it is possible to control generation of static electricity by using a material having conductivity for the cleaning bath and prevent impurities such as particulates from attaching to the cleaning bath and a wafer from being contaminated.

For example, conductive fluorocarbon resin is preferable as a material having conductivity, heat resistance, and chemical resistance.

* Cover

The cleaning bath of the present invention has a movable cover at its top. When the cover is closed, the cleaning bath is sealed. Therefore, it is possible to completely isolate an object to be cleaned from the air and minimize the exposure of a silicon wafer to the air. As a result, prevention of an oxide film from being formed in the cleaning process is realized which is not realized by the prior art.

It is preferable to set the cover so that it is opened or closed by moving it upward or downward. When the cover can be opened or closed by moving it upward or downward and a gas introduction port serving as gas introducing means to be described later is formed on the cover, it is possible to minimize the exposure of an object to be cleaned to the air because an inert gas is continuously flown through the introduction port when the cover is opened and therefore the gas enters a cleaning bath.

By using the cleaning bath, it is possible to use all chemicals in one cleaning bath.

(Rotating means)

It is preferable that the rotating means of the present invention has an automatic control system using, for example, a microprocessor for realizing smooth and continuous control from stationary state to high-speed rotation and vice versa. This is because, in the present invention, ozone-cleaning, ultrapure-water-cleaning, and chemical-cleaning are performed in the same bath and each type of cleaning has a suitable rotational speed range.

(Gas introducing means)

It is one of the greatest features of the present invention to use gas introducing means. It is preferable to form a gas introduction port at the top of a cleaning bath. That is, by forming the port at the top, it is possible to make a downflow atmosphere for continuously flowing gas from the top to the bottom. In this case, because gas is continuously blown onto the surface of an object to be cleaned, it is possible to remove impurities from the surface of the object, prevent the impurities from attaching to the object again, and realize higher-cleanliness cleaning.

(Object-to-be-cleaned holding means)

The object-to-be-cleaned holding means comprises a spindle, at least three arms extending in the radius direction from the top of the spindle, and a protrusion having a terraced portion and formed at the tip of each arm. It is preferable to use object-to-be-cleaned holding means in which protrusions are arranged so that, when a wafer having an orientation flat is horizontally mounted on the holding means, the inside of at least one protrusion contacts the lateral of the orientation flat of the wafer and the insides of other protrusions contact the periphery of the circular arc of the wafer.

FIG. 4 shows the shape of the above object-to-be-cleaned holding means. The object-to-be-cleaned holding means minimizes the area for contacting the object to be cleaned.

That is, the holding means realizes three-point holding using a centrifugal force according to rotation, unlike vacuum holding or mechanical holding, and one of the three points is set to a position for supporting the orientation flat of the wafer. By using the object-to-be-cleaned holding means, it is possible to hold an object to be cleaned by only three points without causing deflection or distortion due to vacuum holding or mechanical holding. Thus, the object to be cleaned has a clean and flat surface free from deflection or distortion.

It is important in view of achieving higher-cleanliness cleaning that the periphery of an object to be cleaned is released except three points. That is, it is important that a uniform chemical solution film is formed on the surface of the object to be cleaned in order to perform uniform cleaning. However, if something is present on the periphery of the object to be cleaned, solution moved to the periphery by a centrifugal force due to rotation collides with the thing and reflects to cause a turbulent flow in the vicinity of the periphery. That is, formation of a uniform solution film is prevented and uniform cleaning is not realized. It is found by the inventor of the present invention for the first time that formation of the above uniform solution film is important to clean an object to be cleaned by rotating it.

(External chemical solution feeder)

FIG. 5 is a flow chart of an external chemical solution feeder. It is preferable to use an external chemical solution feeder having a tank at a high place without using a pump when feeding a chemical solution to a silicon wafer. By using no mixed chemical solution pump, it is possible to prevent contamination by the pump and elution of impurities into a chemical solution and feed the chemical solution at a low pressure.

Moreover, though the type of a chemical solution and the quantity of the chemical solution are not restricted, it is preferable to use an external chemical solution feeder having two independent chemical solution feed lines such as a line for hydrofluoric acid, hydrogen peroxide, and ultrapure water and a line for ammonium hydroxide, hydrogen peroxide, and ultrapure water and an automatic chemical solution mixer for automatically mixing chemical solutions by controlling the flow rate. This makes it possible to feed chemical solutions with a constantly same mixture ratio only by replenishing stock solutions without contaminating the chemical solutions each other. As a result, high-cleanliness cleaning with chemical solutions free from secondary contamination of an object to be cleaned is realized.

(Nozzle)

FIG. 6 is a positional schematic view of nozzles in a cleaning bath. The nozzle mode example shown in FIG. 6 is the mobile type in which a plurality of nozzles are integrated by a nozzle rack and all the nozzles move together. Because the nozzle rack is the mobile type, it is possible to feed a chemical solution and ultrapure water from any position on an object to be cleaned. Moreover, because this is not the spraying type such as an existing shower nozzle, it is possible to smoothly and continuously feed a chemical solution and ultrapure water at a constant flow rate.

Setting every nozzle to one nozzle rack has an important meaning in achieving high-cleanliness cleaning. That is, it is possible to feed another type of chemical solution while feeding one type of chemical solution. For example, it is possible to start feeding the chemical solution of hydrofluoric acid, hydrogen peroxide and ultrapure water immediately before rising with ultrapure water is completed. Thus, it is possible to decrease the time for exposing an object to be cleaned to the air and control the generation of native oxides.

It is preferable to use a straight nozzle whose inside diameter is the same up to the solution exit as shown in FIG. 7(a). Moreover, it is preferable to arrange the cross section of the solution exit so that it is horizontal to an object to be cleaned. When using the above nozzle, it is possible to uniformly clean the surface of the object by dropping a chemical solution or ultrapure water just under the solution exit as a continuous fluid so that a dropping point comes to the rotational center of the object because the dropped chemical solution or ultrapure water is uniformly expanded in the surface due to a centrifugal force. That is, in the case of the nozzle whose solution exit is narrowed as shown in FIG. 7(b), a chemical solution coming out of the solution exit becomes fog and therefore the chemical solution cannot be fed as a continuous fluid. Moreover, in the case of the nozzle whose solution exit face is not horizontal as shown in FIG. 7(c), it is impossible to uniformly feed a chemical solution onto the surface because the quantity of the chemical solution fed from the solution exit varies or the chemical solution does not drop just under the solution exit.

(Back-cleaning spray nozzle)

It is preferable to use back-cleaning spray nozzles each of which is independently used for a chemical solution line and an ultrapure water line as the back-cleaning nozzles of the present invention. Because every spray nozzle has an independent line, it is possible to clean the back with a chemical solution and ultrapure water, which is impossible by an existing cleaning apparatus. Moreover, because every nozzle has an independent line, it is possible to simultaneously clean the surface and the back with different chemical solutions. For example, it is possible to clean the surface with hydrofluoric acid, hydrogen peroxide, and ultrapure water and the back with ultrapure water at the same time. As a result, a clean surface can be obtained which is not contaminated by contaminants coming from the back.

(Ultrapure water feed line)

It is preferable that the ultrapure water feed line of the present invention must resist ozone because ozone is added to ultrapure water. Therefore, it is preferable to use a line made of a stainless steel pipe provided with surface treatment (e.g. passive-state making treatment) or fluorocarbon resin. A line extended from an ozone generator is connected to the vicinity of the end of the ultrapure water feed line through an automatic valve, which makes it possible to add ozone. Therefore, it is possible to have the ultrapure water feed line and the ozone-added ultrapure water line for common use and simplify the pipe arrangement in the apparatus.

(Ozone adding means)

FIG. 8 is a flow chart of an ultrapure water line and an ozone adding line. It is preferable that the cleaning apparatus of the present invention includes a small ozone generator using ultrapure water as a material because the ozone adding means of the present invention is able to minimize decomposition of ozone by adding ozone at a position closest to the use point. That is, the cleaning apparatus of the present invention controls addition of ozone generated by an ozonizer by changing automatic valves.

Moreover, by incorporating the ozonizer into the cleaning apparatus, it is possible to downsize the apparatus and disuse peripheral units.

It is preferable to provide the ultrapure water feed line with a bypass line through a valve and set an ozone generator on the bypass line. Moreover, it is preferable to set the bypass line in the cleaning bath. By setting the ozone generator in the cleaning bath, it is possible to decrease the distance between the ozone generating source and an ozone feed destination. That is, it is possible to improve the cleaning efficiency because generated ozone can be fed to the feed destination before zone decreases.

(Cleaning-bath inner-wall cleaning means)

The cleaning-bath inner-wall cleaning means of the present invention makes it possible to wash a used contaminated chemical solution on the inner wall away with ultrapure water and keep a cleaning bath clean. Thus, a clean silicon wafer surface is obtained because secondary contamination of a silicon wafer due to a contaminated chemical solution is prevented.

Moreover, because the chemical solution attached to the wall does not mix with a chemical solution in the next process, only on type of a mixture of waste chemical solution and waste ultrapure water is produced in one process and therefore waster liquid recovery is simplified.

(Drainage system)

FIG. 9 shows a schematic view of drainage at the bottom of a cleaning bath. It is preferable that the drainage system of the present invention interlocks with a chemical solution feeder and a ultrapure water system and it is able to automatically change the three systems of an acid-alkali system, a hydrofluoric acid system, and a general drainage system and made of a material having chemical resistance and heat resistance. That is, drainage is assorted for each type of a chemical solution used by changing drainage lines with three drainage ports and automatic valves connected to the ports. Therefore, an apparatus is realized which is able to discharge waste liquids without mixing even if all chemical-solution-cleaning processes are performed in one cleaning bath and easily recover waste liquids.

(Automatic control system)

It is preferable to use an automatic control system for integrally controlling all mechanisms as the automatic control system of the present invention. In the case of the cleaning apparatus of the present invention, the time difference between mechanism operations under the cleaning process is previously programmed. Therefore, the cleaning apparatus of the present invention covers all types of controls performed by an existing cleaning apparatus, including prevention of native oxides from depositing by simultaneously flowing a chemical solution and ultrapure water at the change of chemical solutions when starting the next process, assorting of waste liquids by accurately changing drainage routes, using of an ultrapure water line and an ozone adding line in common by intermittently adding ozone to ultrapure water, control of a chemical solution to be fed, control of an optimum feed time, correspondence to emergency, etc. As a result, processes performed by operator's hand are disused, causes of wafer contamination are eliminated, and a high-cleanliness cleaning process is realized. Moreover, safety of operators is also secured.

DESCRIPTION OF SYMBOLS

Figure 1:
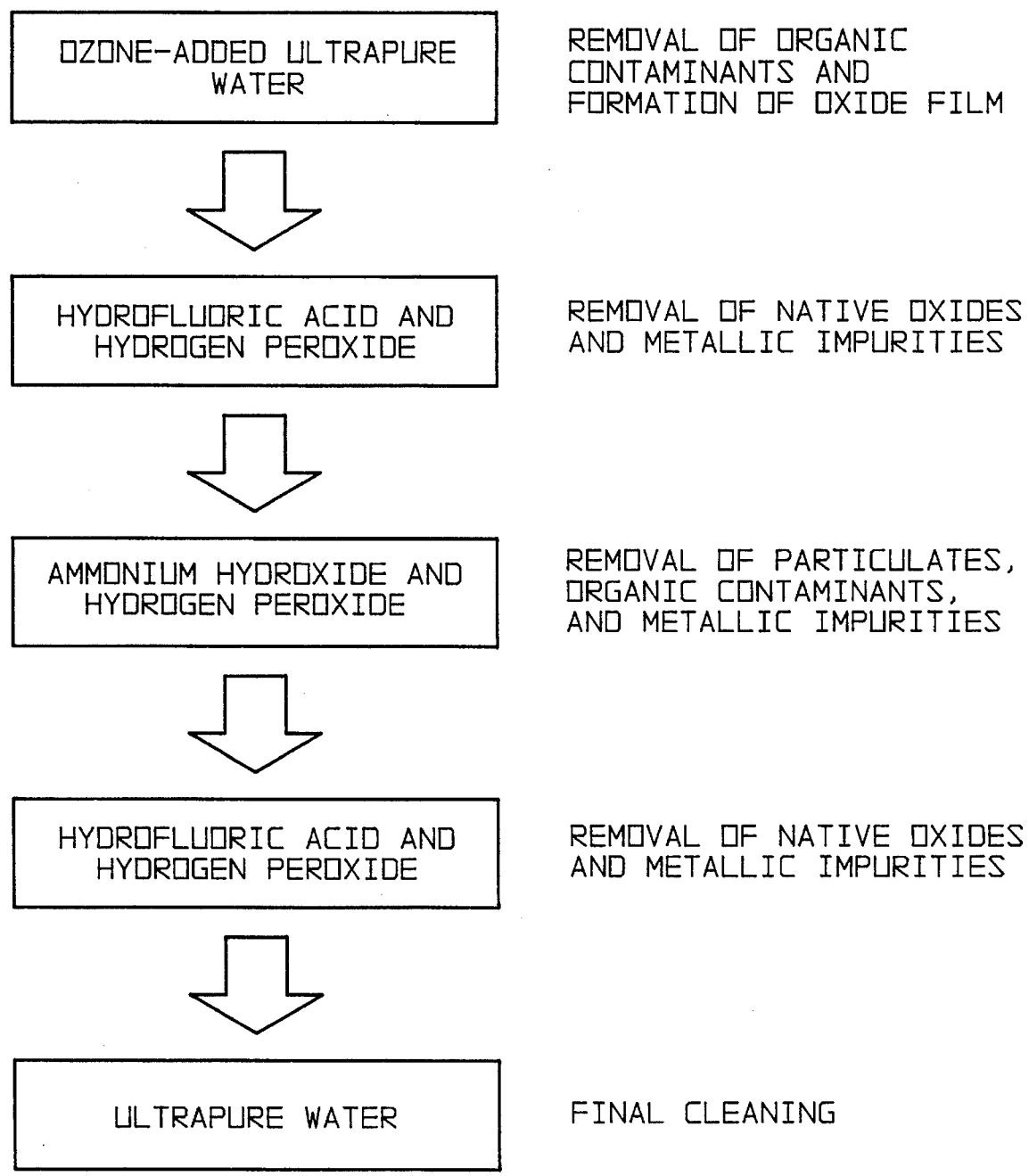
FIG. 1 is a chart showing the principle of the processes of the cleaning method of the present invention.

1: Operation panel 2: Nozzle rack 2a: First nozzle 2b: Second nozzle 2c: Fifth nozzle 3: Back cleaning nozzle 3a: Third nozzle 3b: Fourth nozzle 3c: Sixth nozzle 4: Chuck 5: To a drainage line 6: To an exhaust line 7: Nitrogen (and other gases) introduction port 8: Cleaning bath 9: Two lines from external chemical solution feeder 10: One line out of ultrapure water line and ozone-added ultrapure water line 11: Wall cleaning nozzle 12: Automatic drainage change valve 13: To drainage and exhaust lines 14: Motor 15: Wafer 16: Sealing hood 17: Mixed chemical solution tank 18: Wafer 19: Mass-flow controller 20: Unmixed chemical solution pump 21: Unmixed chemical solution tank 22: Filter 23: To recycling system (or waste liquid tank) 24: To first and second nozzles 25: Entrance for nitrogen purge 26: First nozzle 27: Second nozzle 28: Fifth nozzle 29: From ultrapure water line and ozone-added ultrapure water line 30: From external chemical solution feeder 31: Ozonizer 32: Automatic ozone-adding valve 33: Automatic ozone-drainage valve 34: Ultrapure water line 35: Inside of cleaning apparatus 36: Ozone-ultrapure water line drainage port 37: Acid- and alkali-line drainage port 38: Hydrofluoric acid line drainage port 39: Automatic valve for changing ozone line drainage and ultrapure water line drainage 40: Automatic valve for changing acid line drainage and alkali line drainage 41: Automatic valve for changing hydrofluoric acid line drainage 42: To general drainage line or ultrapure water recovery line 43: To acid- and alkali-line drainage or recovery line 44: To hydrofluoric acid line drainage or recovery line

BEST MODE FOR CARRYING OUT THE INVENTION

FIG. 1 shows the concept of the cleaning method of the present invention.

In FIG. 1, cleaning with sulfuric acid, hydrogen peroxide, and ultrapure water and cleaning with hydrochloric acid, hydrogen peroxide, and ultrapure water are disused which have been used for removing organic contaminants so far. Therefore, two processes are disused among the three processes of cleaning with sulfuric acid, hydrogen peroxide, and ultrapure water, cleaning with hydrochloric acid, hydrogen peroxide, and ultrapure water, and cleaning with ammonium hydroxide, hydrogen peroxide, and ultrapure water. Thus, it is possible to decrease the load for air conditioning of a clean room.

Moreover, because cleaning with ozone-added ultrapure water is used, waste liquid of sulfuric acid which is difficult to recycle is not produced, waste liquid of ozone is discharged which can be recycled easily and discharged as general drainage.

Figure 2:
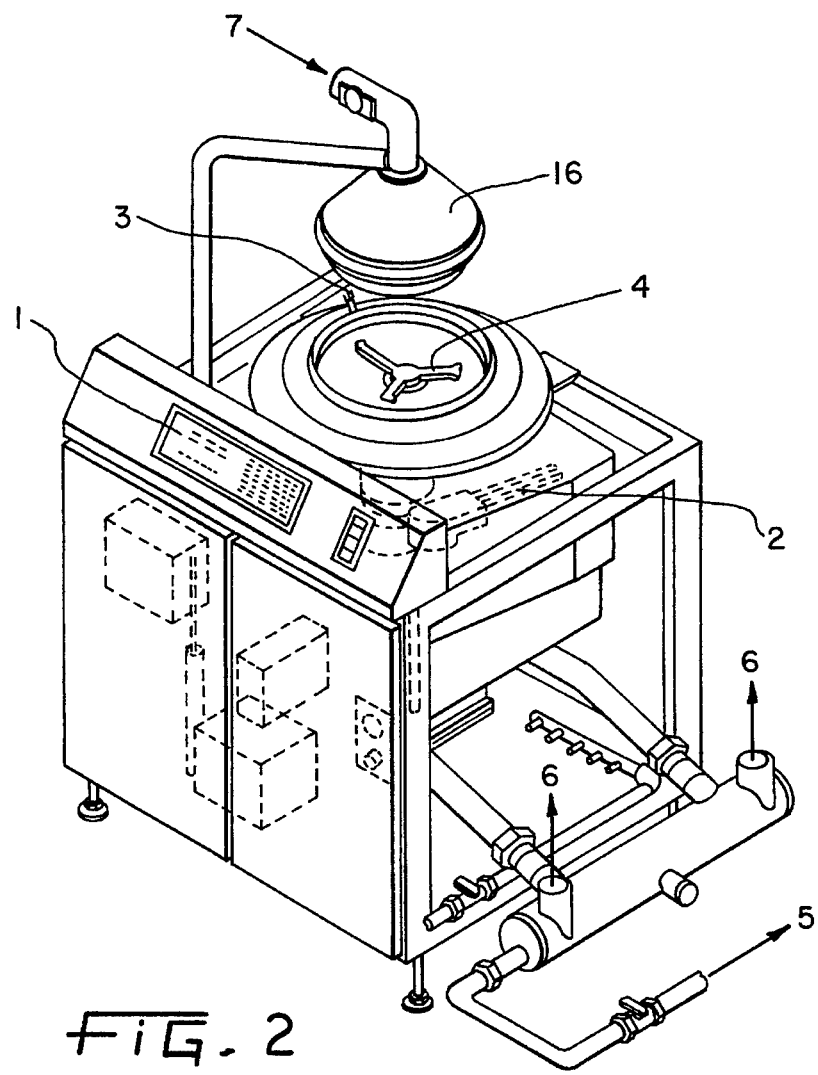
FIG. 2 is a perspective view of the cleaning apparatus which is an embodiment of the present invention.
Figure 3:
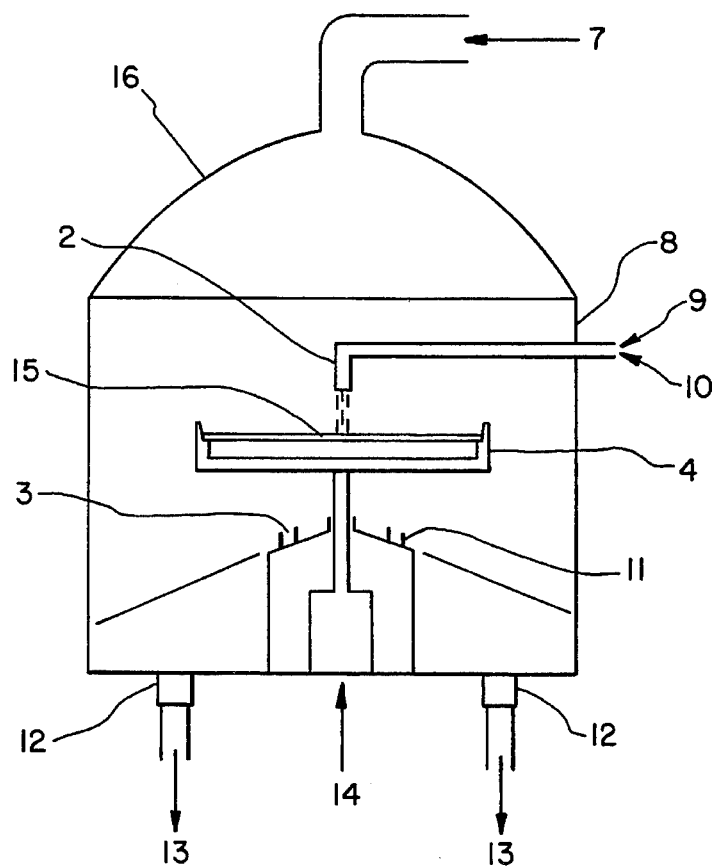
FIG. 3 is a conceptual view of the cleaning bath of the cleaning apparatus which is an embodiment of the present invention.

FIG. 2 shows an external view of a cleaning apparatus and FIG. 3 shows a schematic view of a cleaning bath.

In FIG. 2, symbol 1 represents an operation panel, 2 represents a nozzle rack equipped with first, second, and fifth nozzles, 3 represents a back cleaning nozzle equipped with third, 4 represents a chuck, 5 represents a drainage line, 6 represents an exhaust line, and 7 represents a nitrogen (and other gases) introduction port.

In FIG. 3, symbol 2 represents a nozzle rack, 3 represents a back cleaning nozzle, 4 represents a chuck, 7 represents a nitrogen (and other gases) introduction port, 8 represents a cleaning bath, 9 represents a connection point with two lines from an external chemical solution feeder, 10 represents a connection point with a line out of a ultrapure water line and an ozone-added ultrapure water line, 11 represents a wall cleaning nozzle, 12 represents an automatic drainage-change valve, 13 represents a connection point with drainage and exhaust lines, 14 represents a motor, 15 represents a wafer, and 16 represents a sealing hood.

The following is the description of the cleaning apparatus of this embodiment.

The cleaning apparatus has the cleaning bath 8 inside and the nitrogen (and other gases) introduction port 7 at the top of the cleaning bath 8. The wafer 15 serving as an object to be cleaned is set to the chuck 4 and the chuck 4 is driven by the motor 14.

Because the nozzle rack equipped with the first, second, and fifth nozzles is the mobile type, it is able to feed a chemical solution and ultrapure water to any position on a wafer.

The third, fourth, and sixth nozzles serve as the back cleaning nozzle 3 to feed a chemical solution to the back of a wafer in the cleaning process.

Figure 4A:
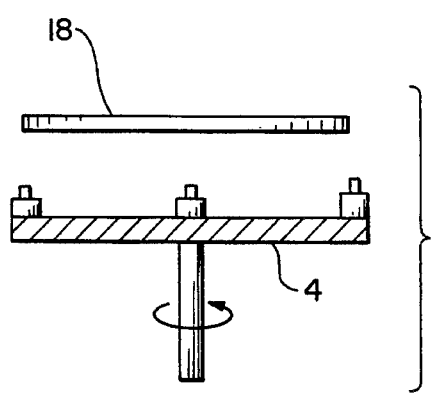
FIG. 4 is a sectional view of the object-to-be-cleaned holding means (chuck) relating to an embodiment of the present invention.
Figure 4B:
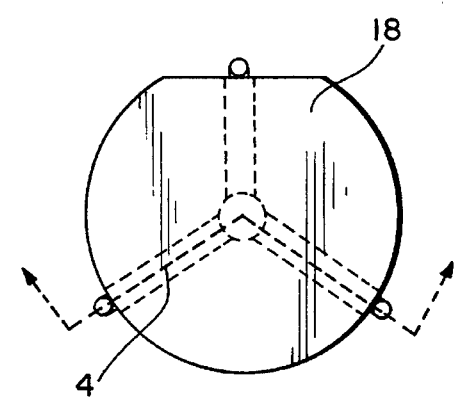
Figure 5:
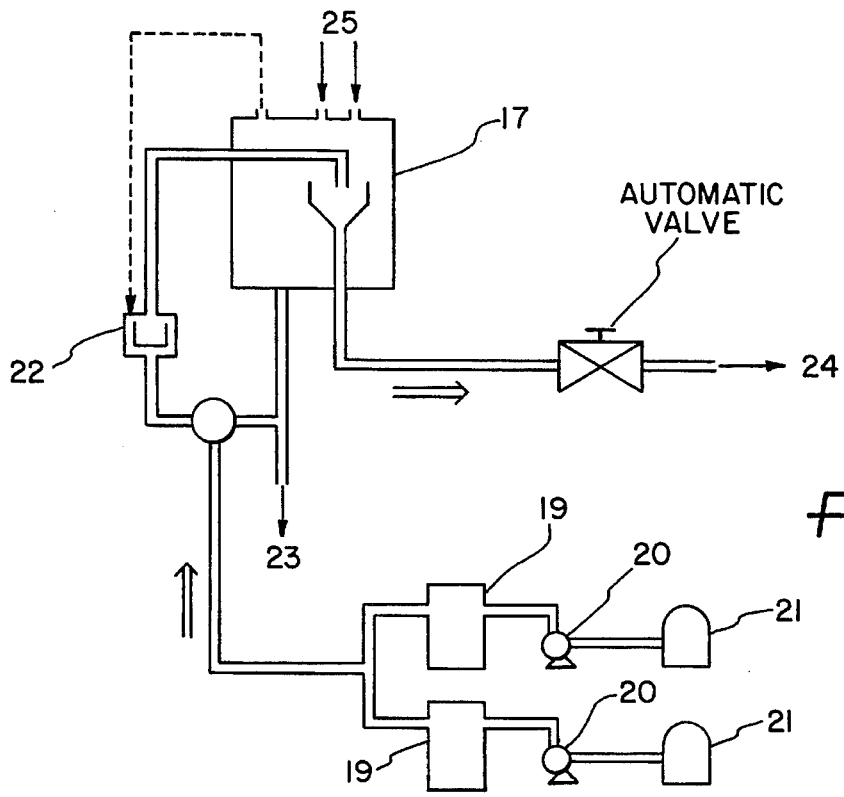
FIG. 5 is a flow chart of the external chemical solution feeder of the cleaning apparatus which is an embodiment of the present invention.
Figure 6:
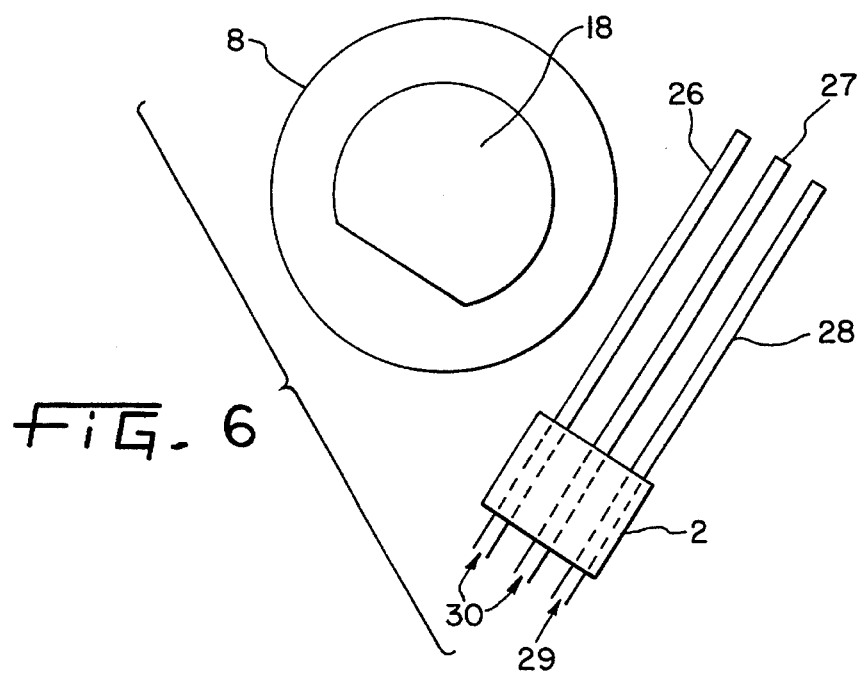
FIG. 6 is a conceptual view showing nozzle positions in a cleaning bath.
Figure 7A:
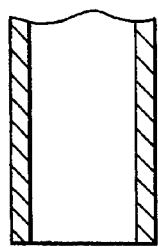
FIGS. 7(a) to 7(c) are sectional views of nozzles, in which (a) shows an embodiment and (b) and (c) show examples for comparison.
Figure 7B:
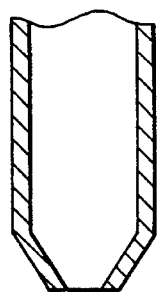
Figure 7C:
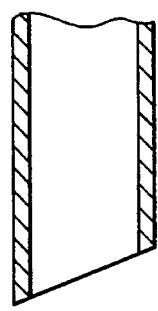
Figure 8:
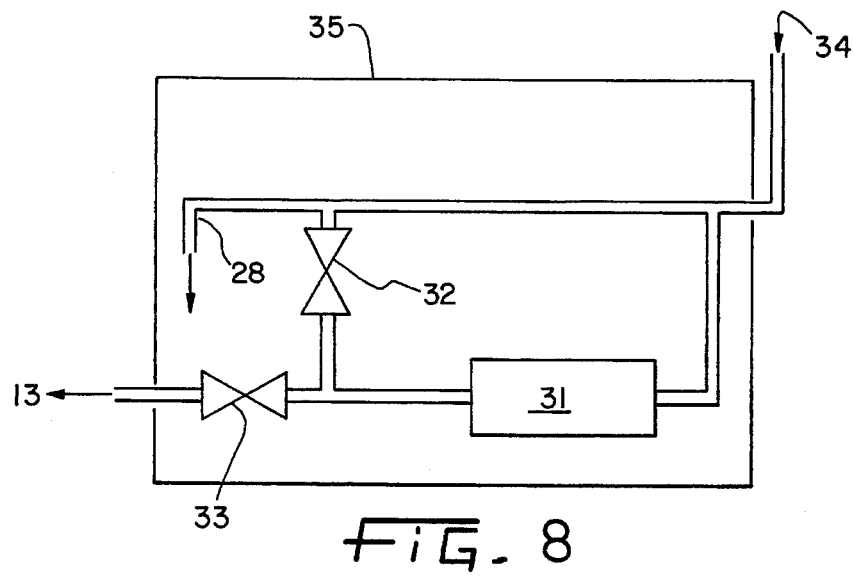
FIG. 8 is a flow chart of the ultrapure water and ozone-adding lines relating to an embodiment of the present invention.
Figure 9A:
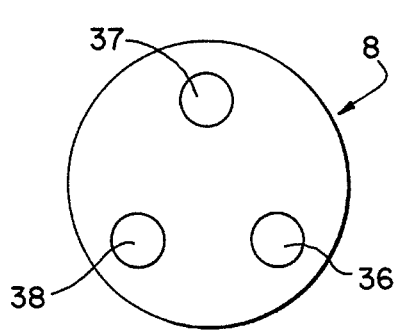
FIG. 9 is a schematic view of the drainage system at the bottom of the cleaning bath of the cleaning apparatus which is an embodiment of the present invention.
Figure 9B:
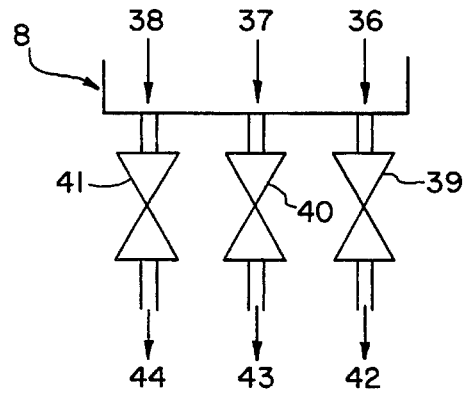
Figure 10:
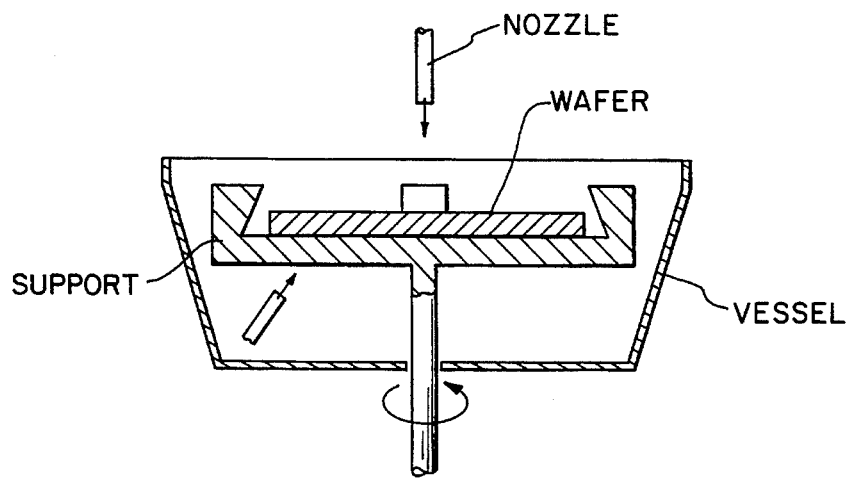
FIG. 10 is a sectional view of an embodiment according to the prior art.

FIG. 4 shows the structure of a chuck, FIG. 5 shows a flow chart of an external chemical solution feeder, FIG. 6 shows a schematic view of nozzle positions in a cleaning bath, FIGS. 7(a) to 7(c) show sectional views of nozzles, FIG. 8 shows a flow chart of a ultrapure water line and an ozone adding line, and FIG. 9 shows a schematic view of drainage at the bottom of a cleaning bath.

In FIG. 4, symbol 4 represents a chuck and 18 represents a wafer.

In FIG. 5, symbol 17 represents a mixed chemical solution tank, 18 represents an automatic valve, 19 represents a mass-flow controller, 20 represents an unmixed chemical solution pump, 21 represents an unmixed chemical solution tank, 22 represents a filter, 23 represents a connection point with a recycling system (or waste liquid tank), 24 represents a connection point with first and second nozzles, and 25 represents a nitrogen purge entrance.

In FIG. 6, symbol 2 represents a nozzle rack, 8 represents a cleaning bath, 18 represents a wafer, 26 represents a first nozzle, 27 represents a second nozzle, 28 represents a fifth nozzle, 29 represents a connection point with a ultrapure water line and an ozone-added ultrapure water line, and 30 represents a connection point with an external chemical solution feeder.

In FIGS. 7(a) to 7(c), sectional views of nozzles which are used in an embodiment and examples for comparison;

In FIG. 7, sectional views of nozzles which are used in a embodiment and examples of comparison.

In FIG. 8, symbol 13 represents a connection point with drainage and exhaust lines, 28 represents a fifth nozzle, 31 represents an ozonizer, 32 represents an automatic ozone-adding valve, 33 represents an automatic ozone-drainage valve, 34 represents an ultrapure water line, and 35 represents the inside of a cleaning apparatus.

In FIG. 9, symbol 8 represents a cleaning bath, 36 represents an ozone- and ultrapure-water-line drainage port, 37 represents an acid- and alkali-line drainage port, 38 represents a hydrofluoric acid line drainage port, 39 represents an automatic valve for changing ozone-line drainage and ultrapure-water-line drainage, 42 represents a connection point wit a general drainage line or ultrapure water recovery line, 43 represents a connection point with acid- and alkali-line drainage lines or a recovery line, and 44 represents a connection point with a hydrofluoric acid drainage line or a recovery line.

The following is the description of an embodiment of the present invention.

Nitrogen is introduced through the gas introduction port 7, the wafer is set to the chuck 4, and the sealing hood 16 is closed. Ultrapure water of 2.5 to 10 cc is fed to the surface of a wafer from the fifth nozzle 28 to uniformly wet the wafer surface by rotating the wafer at 300 rpm. Thereby, the wettability is improved and other processes are smoothly performed.

Then, ozone-added ultrapure water is fed to the surface from the fifth nozzle 28 to oxidize the organic contaminants on the surface. At the same time, native oxides are formed on the wafer surface and feed of the ozone from the fifth nozzle 28 is stopped to rinse the surface with ultrapure water and wash the ozone-added ultrapure water and impurities away. Then, a mixture of hydrofluoric acid and hydrogen peroxide is fed from the first nozzle 26 to remove the native oxides from the surface and ultrapure water is fed from the fifth nozzle 28 to wash the chemical solution and impurities away. Then, a mixture of ammonium hydroxide and hydrogen peroxide is fed from the second nozzle 27 to remove particulates from the surface, rinse the surface with ultrapure water fed from the fifth nozzle 28, and wash the chemical solution and impurities away. Finally, a mixture of hydrofluoric acid and hydrogen peroxide is fed from the first nozzle to remove native oxides again, feed of ultrapure water is started from the fifth nozzle immediately before stopping the feed of the chemical solution from the first nozzle 26, feed of the chemical solution from the first nozzle 26 is stopped to wash the chemical solution and impurities away, and thereafter feed of ultrapure water from the fifth nozzle 28 is stopped and the wafer 18 is rotated and dried to complete all processes.

While these cleaning processes are performed, the back is simultaneously cleaned by continuously feeding the same chemical solution as that used for the surface cleaning toward the back from the back cleaning nozzle 3. Moreover, the inner wall of the cleaning bath is continuously cleaned with ultrapure water fed from the wall cleaning nozzle 11. Furthermore, because all processes are continuously performed in one cleaning bath, it is unnecessary to transfer the wafer during the cleaning processes, the time in which the wafer is exposed to the air when changing chemical solutions is minimized and native oxides can be decreased up to a limit.

The external chemical solution feeder in FIG. 6 uses the unmixed chemical solution pump 20 feeds chemical solutions from the unmixed chemical solution tank 21 to the mixed chemical solution tank 17 set at a high place by the unmixed chemical solution pump 20. The flow rates of unmixed chemical solutions are controlled by the mass-flow controller 25 so that the chemical solutions are always mixed at a constant mixing ratio. The chemical solution entering a mixing line passes through the filter 22 and is sent to a nozzle from a funnel-shaped pan in the mixed chemical solution tank 17 which is continuously nitrogen-purged in accordance with a difference of elevation. Excess chemical solution which is not used is recirculated and continuously filtered.

The ozone adding line in FIG. 8 introduces ultrapure water branched from the ultrapure water line 34 into the ozonizer 31 to generate ozone and controls injection by the automatic ozone-adding valve 32 and the automatic ozone-drainage valve. The ozonizer used for this cleaning apparatus generates ozone by electrolyzing ultrapure water and dissolves the ozone in ultrapure water by using a film module and generates high-concentration ozone-added ultrapure water. Because the ozonizer is built in the cleaning apparatus, it is possible to add ozone immediately before a use point.

The drainage system in FIG. 9 assorts drainage by changing the automatic valve 39 for changing ozone line drainage and ultrapure water line drainage, the automatic valve for changing acid line drainage and alkali line drainage, and the automatic valve 41 for changing hydrofluoric acid line drainage. The assorted drainage is sent to a recovery system or a drainage line. Therefore, waste liquids can be discharged without mixing each other.

Industrial Applicability

The present invention makes it possible to provide high-quality silicon wafers at a low cost by improving the cleanliness of silicon wafers, improving the efficiency of cleaning processes, and decreasing the consumption of chemical solutions for cleaning in the semiconductor industry and thereby integrally decreasing the production cost. Therefore, the yield is also improved and the cost of semiconductor related products can be decreased.

Moreover, because all processes are performed in a completely closed system, danger of field operators can be decreased.

It is a matter of course that chemicals and water are easily recycled without contaminating the global environment and therefore resources can effectively be used.

We claim:

1. A cleaning apparatus comprising at least:

a cleaning bath having a movable cover at its top for sealing the bath by closing the cover;

object-to-be-cleaned holding means for holding an object to be cleaned in the cleaning bath;

rotating means for rotating the object-to-be-cleaned holding means;

gas introducing means for introducing gas into the cleaning bath;

a first nozzle for feeding a first chemical solution to the surface of an object to be cleaned held by the object-to-be-leaned holding means;

a second nozzle for feeding a second chemical solution to the surface of an object to be cleaned held by the object-to-be-cleaned holding means;

a third nozzle for spraying a first chemical solution onto the back of an object to be cleaned held by the object-to-be-cleaned holding means;

a fourth nozzle for spraying a second chemical solution onto the back of an object to be cleaned held by the object-to-be-cleaned holding means;

a fifth nozzle for feeding ultrapure water to the surface of an object to be cleaned held by the object-to-be-cleaned holding means;

a sixth nozzle for spraying ultrapure water onto the back of an object to be cleaned held by the object-to-be-cleaned holding means;

a chemical solution feed line connected to each of the first to the fourth nozzles;

an external chemical solution feeder connected to each chemical solution feed line for feeding a chemical solution;

an ultrapure water feed line connected to the fifth and sixth nozzles;

ozone adding means for selectively adding ozone to ultrapure water; and a drainage line for completely assorting waste liquids after cleaning.

2. The cleaning apparatus according to claim 1, wherein a bypass line is set to an ultrapure water feed line through a valve and an ozone generator is set to the bypass line.

3. The cleaning apparatus according to claim 2, wherein the bypass line is provided in the cleaning bath.

4. The cleaning apparatus according to claim 1, wherein the introduction port of the gas introducing means is formed on the cover of the cleaning bath by turning the opening of the port downward.

5. The cleaning apparatus according to claim 1, wherein the cleaning bath is made of a material having conductivity and chemical resistance.

6. The cleaning apparatus according to claim 1, wherein an arrangement for controlling the rotational speed of the rotating means is included.

7. The cleaning apparatus according to claim 1, wherein the object-to-be-cleaned holding means comprises a spindle, at least three arms extending in the radius direction from the top of the spindle, and a protrusion having a terraced portion and formed at the tip of each arm, and these protrusions are arranged so that the inside of at least one protrusion contacts the lateral of the orientation flat of a horizontally-mounted object to be cleaned and the insides of the other protrusions contact the periphery of the circular arc portion of the object to be cleaned.

8. The cleaning apparatus according to claim 1, wherein the external chemical solution feeder has an automatic chemical solution mixer.

9. The cleaning apparatus according to claim 1, wherein the external chemical solution feeder has a chemical solution tank set at a high place.

10. The cleaning apparatus according to claim 1, wherein the external chemical solution feeder has a line for hydrofluoric acid, hydrogen peroxide, and ultrapure water and a line for ammonium hydroxide, hydrogen peroxide, and ultrapure water.

11. The cleaning apparatus according to claim 1, wherein the chemical solution feed line has a line for hydrofluoric acid, hydrogen peroxide, and ultrapure water and a line for ammonium hydroxide, hydrogen peroxide, and ultrapure water.

12. The cleaning apparatus according to claim 1, wherein the first and the fifth nozzles have a flat tip.

13. The cleaning apparatus according to claim 1, wherein the ultrapure water feed line has cleaning-bath inner-wall cleaning means.

14. The cleaning apparatus according to claim 1, wherein the drainage line has an automatic controller and an automatic valve so that acid and alkali drainage, hydrofluoric acid drainage, and general drainage can be assorted and recovered immediately before a drainage port in the controller.

* * * * *